US007511569B2

(12) United States Patent
Jang

(10) Patent No.: US 7,511,569 B2
(45) Date of Patent: Mar. 31, 2009

(54) CIRCUIT FOR SUPPLYING A VOLTAGE IN A MEMORY DEVICE

(75) Inventor: Chae Kyu Jang, Icheon-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 101 days.

(21) Appl. No.: 11/687,459

(22) Filed: Mar. 16, 2007

(65) Prior Publication Data

US 2008/0088362 A1 Apr. 17, 2008

(30) Foreign Application Priority Data

Oct. 12, 2006 (KR) ...................... 10-2006-0099441

(51) Int. Cl.
*G05F 1/10* (2006.01)
*G11C 7/00* (2006.01)

(52) U.S. Cl. ................... 327/543; 327/540; 365/189.09

(58) Field of Classification Search ......... 327/540-543, 327/530, 538; 365/189.09, 203, 226
See application file for complete search history.

(56) References Cited

U.S. PATENT DOCUMENTS

| | | | | |
|---|---|---|---|---|
| 6,201,378 | B1 * | 3/2001 | Eto et al. | 323/313 |
| 6,707,717 | B2 * | 3/2004 | Jun-Lin | 365/185.21 |
| 7,251,169 | B2 * | 7/2007 | Takeuchi | 365/189.09 |
| 7,362,169 | B2 * | 4/2008 | Liu et al. | 330/51 |
| 7,450,439 | B2 * | 11/2008 | Lee et al. | 365/189.09 |

FOREIGN PATENT DOCUMENTS

| | | |
|---|---|---|
| KR | 1020050041061 | 5/2005 |
| KR | 100586555 | 5/2006 |

OTHER PUBLICATIONS

Official Action for Korean App. 2006-99441.

* cited by examiner

*Primary Examiner*—Dinh T. Le
(74) *Attorney, Agent, or Firm*—Lowe Hauptman Ham & Berner, LLP

(57) ABSTRACT

A circuit for supplying an operation voltage in a memory device includes a voltage supplying section that supplies a constant voltage to an output section through a first path and constantly discharges a portion of the supplied voltage through a second path. A third path section provides the supplied voltage to the output section through a third path in accordance with a controlling signal and a fourth path section discharges a portion of the voltage supplied from the voltage supplying section through a fourth path different from the second path in accordance with the controlling signal. A controller is configured to output the controlling signal that controlling the third and fourth path sections in accordance with an operation mode in the memory device. The circuit controls a dead zone window in accordance with a mode, thereby preventing an unnecessary consumption of power.

9 Claims, 5 Drawing Sheets

CIRCUIT FOR SUPPLYING A VOLTAGE IN A MEMORY DEVICE

CROSS-REFERENCE TO RELATED APPLICATIONS

The present application claims priority from Korean Patent Application No. 2006-99441, filed on Oct. 12, 2006, the contents of which are incorporated herein by reference in its entirety.

BACKGROUND OF THE INVENTION

The present invention relates to a circuit for supplying an operational voltage in a memory device. More particularly, the present invention relates to a circuit for supplying an operational voltage in a memory device that prevents an unnecessary consumption of current. The circuit changes a dead zone in accordance with an operational mode when supplying a precharge voltage for a bit line of a dynamic random access memory (hereinafter, referred to as "DRAM"), or for a cell plate voltage.

The amount of data to be processed by computers has increased. Accordingly, a speedup in the processing of data is required.

For example, the storage capacity of DRAM devices has improved by leaps and bounds in accordance with the development of miniature forming technique over a memory cell pattern. Accordingly, a storage device made up of one chip can store more data quantity.

Generally, the DRAM memorizes information as a charge in a metal oxide semiconductor capacitor (hereinafter, referred to as "MOS capacitor"). Based upon the charging or discharging of one MOS capacitor, it is determined whether data information for a bit is memorized. That is, the charging condition corresponds to 'high', and the discharging condition corresponds to 'low'. As a result, the condition of memorized information may be determined by one capacitor for one bit.

On the other hand, to maintain the record of data in the DRAM, an operation of again writing the data should be performed so that the charge is not discharged by comparing the voltage with a reference voltage. This re-writing operation is referred to as refresh.

In case the DRAM is a MOS integrated circuit, when the condition of the integrated circuit is bad, charge in the DRAM device is discharged by a leakage current in a few milliseconds (ms), and thus the DRAM should generally be recharged in 2 ms. Accordingly, the DRAM device refreshes every memory cell therein in less than 2 ms.

SUMMARY OF THE INVENTION

One aspect of the present invention includes a circuit for providing a voltage in a memory device that controls the voltage through control of the dead zone of a bit line precharge voltage or a cell plate voltage in accordance with modes.

A circuit for supplying a voltage in a memory device according to one embodiment of the present invention includes a voltage supplying section configured to supply a constant voltage to an output section through a first path, and constantly discharge some of the supplied voltage through a second path. A third path section is configured to provide the voltage supplied from the voltage supplying section to the output section through a third path different from the first path in accordance with a controlling signal. A fourth path section is configured to discharge some of the voltage supplied from the voltage supplying section through a fourth path different from the second path in accordance with the controlling signal. In addition, a controller is configured to output the controlling signal for controlling the third path section and the fourth path section in accordance with an operation mode in the memory device.

The controlling signal is an output of a NOR gate in accordance with a bank active signal inputted to the memory device and a delayed active signal generated by delaying the bank active signal during a predetermined delay time, wherein the bank active signal and the delayed bank active signal are input of the NOR gate.

The delay time is adjusted in accordance with a voltage and a response time required for operation of the memory device.

The third path section operates in the operation mode under control of the controlling signal, and the fourth path section operates in a standby mode based upon the controlling signal.

The third path section includes a first transistor, and the fourth path section includes a second transistor, wherein the second transistor has response characteristics opposed to the first transistor, and the transistors operate in accordance with the controlling signal.

A circuit for supplying a voltage in a memory device according to another embodiment of the present invention includes a voltage supplying section configured to supply a constant voltage to the memory device through a first path and an output section, and constantly discharge some of the supplied voltage through a second path. A third path section is configured to supply the voltage to the output section through a third path different from the first path when the memory device is operated in an operation mode. A fourth path section is configured to discharge some of the voltage supplied from the voltage supplying section through a fourth path different from the second path when the memory device is operated in a standby mode. In addition, a controller is configured to output a controlling signal for controlling the third path section and the fourth path section in accordance with the mode of the memory device.

As described above, a circuit of providing operation voltage in a memory device controls the charge or discharge of a bit line precharge voltage, or a cell plate voltage, using a switching device controlled by a bank active signal, thereby changing a dead zone window in accordance with a mode. As a result, power is properly consumed in accordance with the mode, and thus the waste of power may be prevented.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings.

Figure 1:
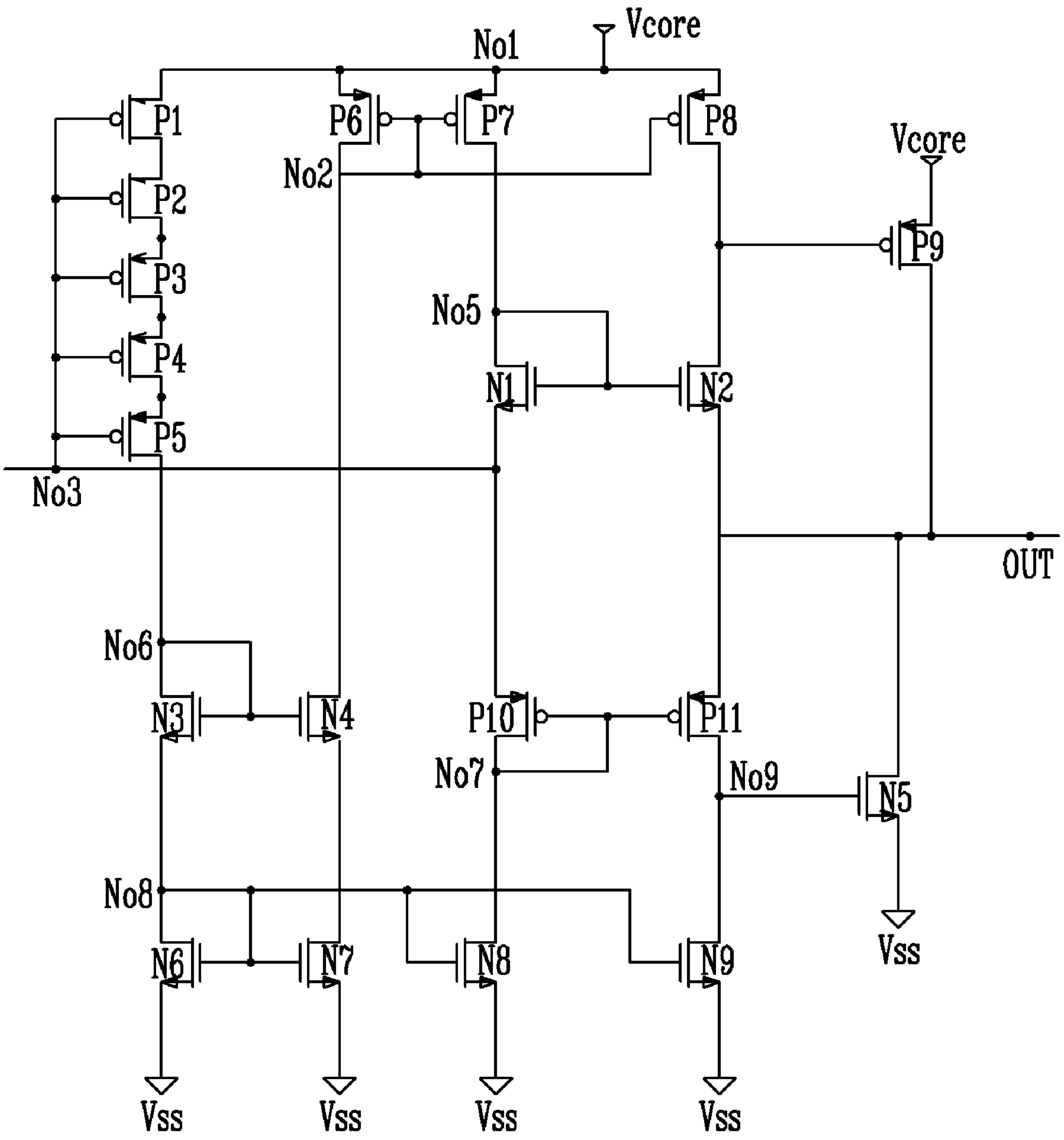
FIG. 1 is a view illustrating a circuit supplying a bit line precharge voltage.

FIG. 1 is a view illustrating a circuit of supplying a bit line precharge voltage, or a cell plate voltage for reading, writing or refreshing operation, etc., in the DRAM.

Referring to FIG. 1, the circuit for supplying the bit line precharge voltage $V_{BLP}$ to a bit line of memory cell for reading, writing or refreshing operation of the DRAM includes a first to eleventh P-MOS transistors P1 to P11, and a first to ninth N-MOS transistors N1 to N9.

In addition, the circuit provides a cell plate voltage $V_{CP}$, wherein the bit line precharge voltage $V_{BLP}$ and the cell plate voltage $V_{CP}$ are applied to a plate terminal of capacitor in the memory cell.

A circuit supplying the bit line precharge voltage $V_{BLP}$ uses $V_{CORE}$ as input voltage. Here, a voltage outputted to an output terminal OUT of the circuit is inputted into a bit line amplifier.

The above circuit may supply the cell plate voltage $V_{CP}$ as well as the bit line precharge voltage $V_{BLP}$. Additionally, the circuit outputs a first voltage when the DRAM operates as an operation mode, and outputs a second voltage when the DRAM operates as a standby mode, wherein the first voltage is identical to the second voltage. As a result, the voltages outputted from the circuit have the same dead zone. In other words, the power consumption in the operation mode is identical to that in the standby mode.

Figure 2:
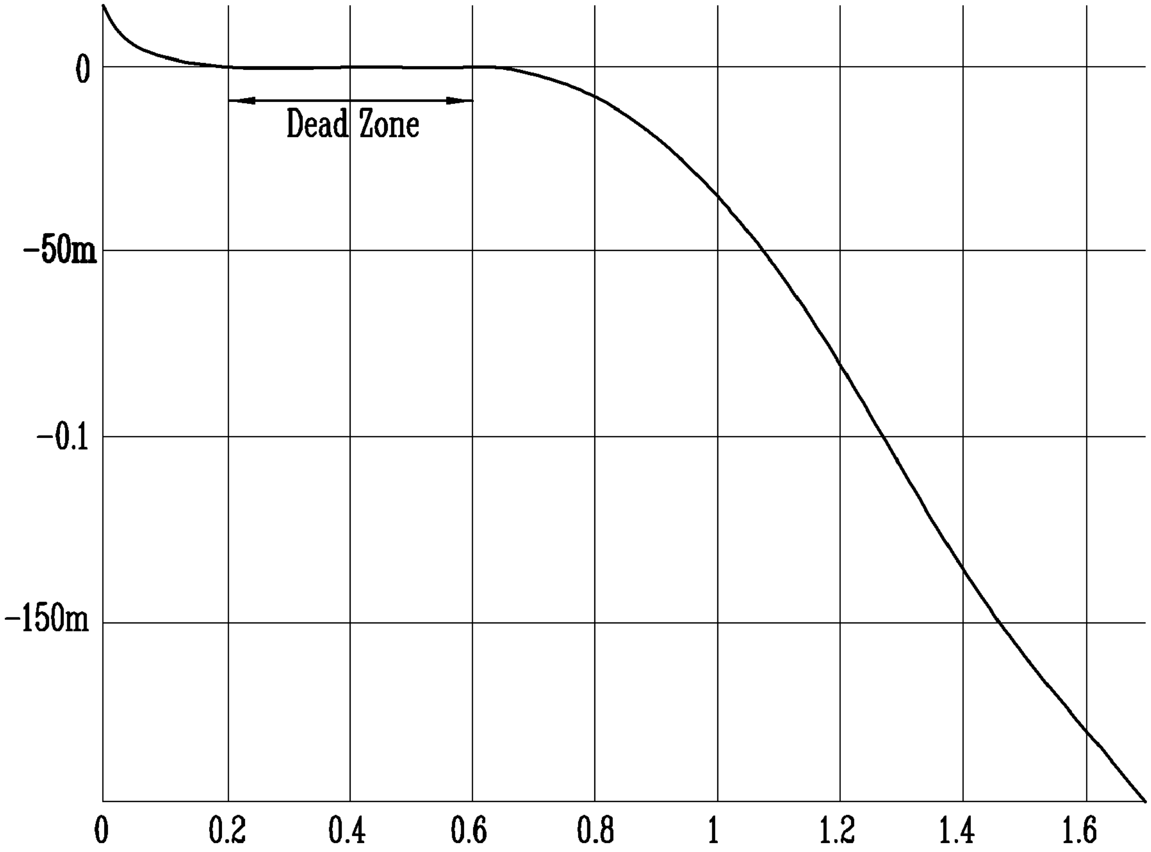
FIG. 2 is a view illustrating an operation simulation of the circuit in FIG. 1.

FIG. 2 is a view illustrating an operation simulation of the circuit in FIG. 1.

As shown in FIG. 2, the same dead zone occurs in the operation mode and the standby mode.

The wider the dead zone, the smaller the consumption of current. Whereas, the narrower the dead zone, the greater the consumption of current.

The operation mode indicates a mode of performing reading, writing or refreshing, etc., of data in the DRAM. Accordingly, the consumption of current of the DRAM in the operation mode is high. Further, a response time in the operation mode should be quick.

In the standby mode, the consumption of current is smaller than that in the operation mode.

However, the circuit provides the same supply current IDD0 to IDD7 depending on the current specification of the DRAM device and provides the same response time irrespective of the operation or standby mode. Accordingly, the bit line precharge voltage $V_{BLP}$ and the cell plate voltage $V_{CP}$ have the same dead zone, irrespective of the above modes.

Figure 3A:
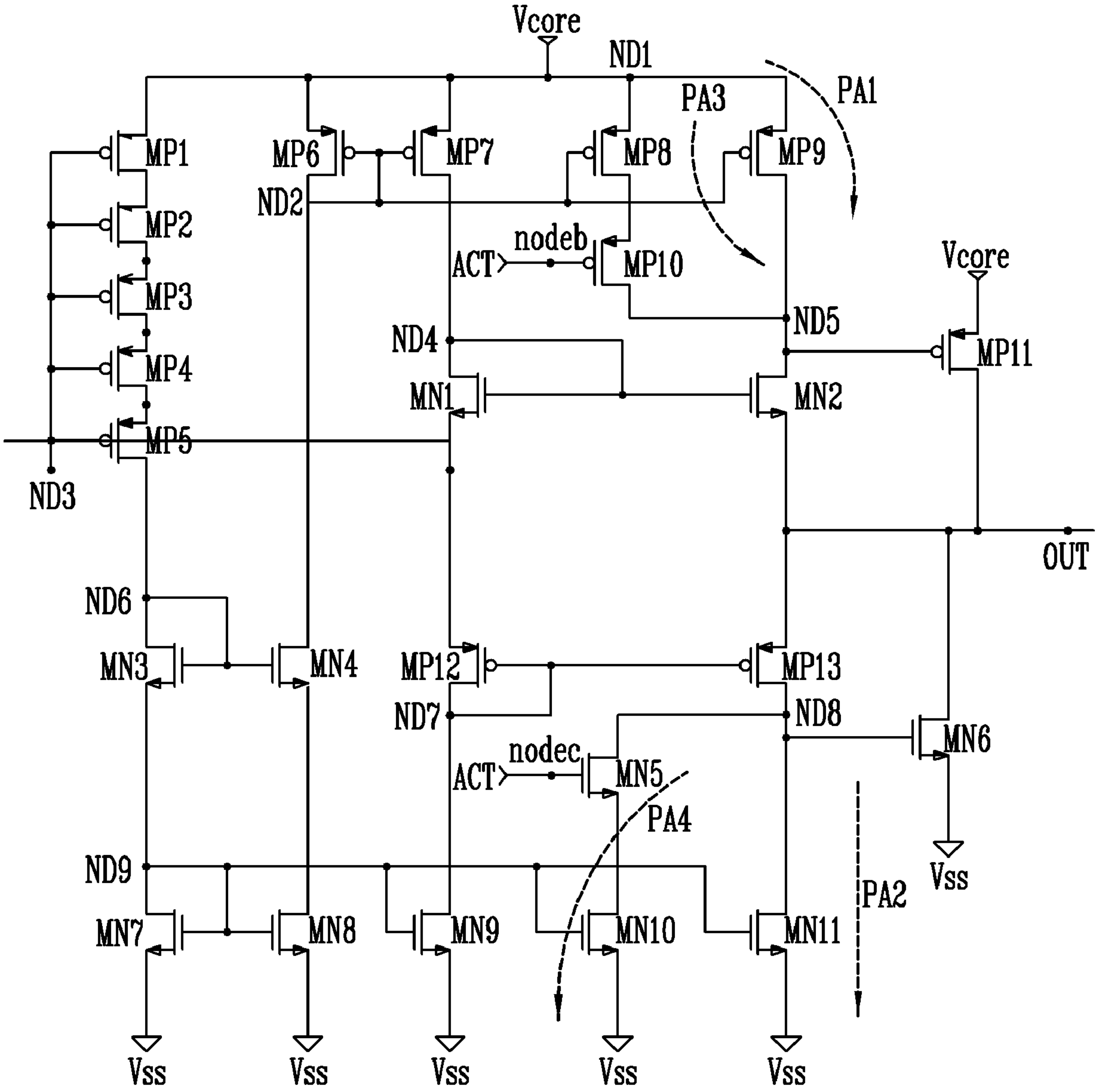
FIG. 3A is a view illustrating a circuit for providing a voltage, according to one embodiment of the present invention.

FIG. 3A is a view illustrating a circuit for providing a voltage according to one embodiment of the present invention.

Referring to FIG. 3A, the circuit for providing a bit line precharge voltage $V_{BLP}$ in a DRAM includes a first to thirteenth P-MOS transistors MP1 to MP13, and a first to eleventh N-MOS transistors MN1 to MN11.

A circuit for generating a cell plate voltage $V_{CP}$ is similar to the circuit for providing the bit line precharge voltage $V_{BLP}$.

The first to fifth P-MOS transistors, MP1 to MP5, are connected in series between a node ND1 and a node ND6. Gates of the first to fifth P-MOS transistors MP1 to MP5 are connected in common to a node ND3.

The node ND1 is connected to an internal supply voltage, i.e. core voltage $V_{CORE}$.

The third N-MOS transistor MN3 is connected between the node ND6 and a node ND9, and the gate of the third N-MOS transistor MN3 is connected to node ND6. In addition, the gate of the third N-MOS transistor MN3 is connected to a gate of the fourth N-MOS transistor MN4.

The seventh N-MOS transistor MN7 is connected between the node ND9 and a ground voltage Vss, and a gate of the seventh N-MOS transistor MN7 is connected to the node ND9. Additionally, the gate of the seventh N-MOS transistor MN7 is connected to a gate of the eighth N-MOS transistor MN8.

The fourth N-MOS transistor MN4 and the eighth N-MOS transistor MN8 are connected in series between the node ND2 and a ground.

The sixth P-MOS transistor MP6 is connected between the first node ND1 and the node ND2, and a gate of the sixth P-MOS transistor MP6 is connected to the node ND2. Further, the gate of the sixth P-MOS transistor MP6 is connected to a gate of the seventh P-MOS transistor MP7.

Moreover, the seventh P-MOS transistor MP7 is connected between the node ND1 and a node ND4.

The first N-MOS transistor MN1 is connected between the node ND4 and the node ND3, and a gate of the first N-MOS transistor MN1 is connected to the node ND4.

The twelfth P-MOS transistor MP12 is connected between the node ND3 and a node ND7, and a gate of the twelfth P-MOS transistor MP12 is connected to the node ND7.

The ninth N-MOS transistor MN9 is connected between the node ND7 and the ground, and a gate of the ninth N-MOS transistor MN9 is connected to the node ND9.

The eighth P-MOS transistor MP8 and the tenth P-MOS transistor MP10 are connected in series between the node ND1 and a node ND5, and a gate of the eighth P-MOS transistor MP8 is connected to the node ND2.

A controlling signal ACT for changing a dead zone window is inputted to a gate of the tenth P-MOS transistor MP10.

The ninth P-MOS transistor MP9 is connected between the node ND1 and the node ND5, and a gate of the ninth P-MOS transistor MP9 is connected the node ND2.

The second N-MOS transistor MN2 is connected between the node ND5 and an OUT mode, and a gate of the second N-MOS transistor MN2 is connected to the gate of the first N-MOS transistor MN1.

The thirteenth P-MOS transistor MP13 is connected between the OUT node and a node ND8, and a gate of the twelfth P-MOS transistor MP12 is connected to the gate of the twelfth P-MOS transistor MP12.

The fifth N-MOS transistor MN5 and the tenth N-MOS transistor MN10 are connected in series between the node ND8 and the ground.

The controlling signal ACT for changing dead zone window is inputted to the gate of the fifth N-MOS transistor MN5.

A gate of the tenth N-MOS transistor MN10 is connected to the node ND9.

The eleventh N-MOS transistor MN11 is connected between the node ND8 and the ground, and is further connected in parallel with the N-MOS transistors MN5 and MN10. Additionally, a gate of the eleventh N-MOS transistor MN11 is connected to the node ND9.

The eleventh P-MOS transistor MP11 is connected between the supply voltage $V_{CORE}$ and the OUT node, and a gate of the eleventh P-MOS transistor MP11 is connected to the node ND5.

The sixth N-MOS transistor MN6 is connected between the OUT node and the ground, and a gate of the sixth N-MOS transistor MN6 is connected to the node ND8.

As described above, the other elements except the P-MOS transistors MP8 and MP10, which form a third path PA3, and the N-MOS transistors MN5 and MN10, which form a fourth path PA4 of the elements of the circuit for supplying the bit line precharge voltage $V_{BLP}$, are the same as in a common circuit for supplying a supply voltage.

The circuit for supplying the bit line precharge voltage $V_{BLP}$, according to one embodiment of the present invention, is formed by adding the precharge (third) path PA3 and a discharge (fourth) path PA4 for changing dead zone window to a circuit for supplying the supply voltage that supplies a constant voltage required for operation.

Hereinafter, the operation of the circuit for supplying the bit line precharge voltage $V_{BLP}$ of the present invention will be described in detail.

A signal having a constant level is inputted through the node ND3. Particularly, the circuit is operated when a low level signal is inputted at node ND3.

In the case wherein the first to fifth P-MOS transistors MP1 to MP5 are turned on by a low level signal inputted through the node ND3, the supply voltage $V_{CORE}$, having a high level connected to the node ND1, is applied to the node ND6.

The third N-MOS transistor MN3 and the fourth N-MOS transistor MN4 are turned on by a high level signal at node ND6, and wherein the supply voltage having a high level is inputted to the node ND9.

The seventh N-MOS transistor MN7 to the eleventh N-MOS transistor MN11 are turned on in accordance with a signal of the node ND9 having high level. Accordingly, when N-MOS transistors MN4 and MN8 are turned on, the node ND2 is connected to a ground voltage and has a low level.

The sixth P-MOS transistor MP6 to the ninth P-MOS transistor MP9 are turned on when the voltage of the node ND2 is at a low level.

Accordingly, the seventh P-MOS transistor MP7 is turned on, and so the supply voltage, having a high level, is applied to the node ND4.

The first N-MOS transistor MN1 and the second N-MOS transistor MN2 are turned on in accordance with a voltage of the node ND4 having a high level.

The node ND7 is connected to the ground voltage because the ninth N-MOS transistor MN9 is turned on and therefore ND7 has a low level. Accordingly, the twelfth P-MOS transistor MP12 and the thirteenth P-MOS transistor MP13 are turned on by the node ND7.

The eighth P-MOS transistor MP8 and the ninth P-MOS transistor MP9 are turned on in accordance with the signal of the node ND2 having a low level.

The tenth P-MOS transistor MP10 is turned on/off according as the controlling signal ACT applied to a node "nodec." Here, in case that the tenth P-MOS transistor MP10 is turned on, the node ND5 is precharged through the first path PA1 corresponding to the ninth P-MOS transistor MP9. Node ND5 is also is precharged through the third path PA3 corresponding to the P-MOS transistors MP8 and MP10. As a result, the time to precharge a voltage at node ND5 may, in the present invention, be more rapid than in the related art.

On the other hand, the voltage rapidly supplied to the node ND5 is outputted to the OUT node through the second N-MOS transistor MN2. Further, the voltage of the node ND5 is rapidly provided to the node ND8 through the second N-MOS transistor MN2 and the thirteenth P-MOS transistor MP13.

The fifth N-MOS transistor MN5 is turned on/off depending upon the controlling signal ACT applied to the nodec node. Here, in case that the fifth N-MOS transistor MN5 is turned on, the voltage at node ND8 is discharged through a second path PA2 connected to the ground voltage through the eleventh N-MOS transistor MN11, and also is discharged through the fourth path PA4 connected to the ground voltage through the N-MOS transistors MN5 and MN10. As a result, the discharge time in the circuit of the present invention is faster than a circuit in the related art. Accordingly, the speed of charging and discharging a voltage outputted to the OUT node may be adjusted in accordance with the controlling signal ACT. Consequently, the dead zone of the bit line precharge voltage $V_{BLP}$ may be controlled by adjusting the speed of charging and discharging of the voltage.

Hereinafter, a circuit for changing the dead zone window using the controlling signal ACT will be described in detail.

Figure 3B:
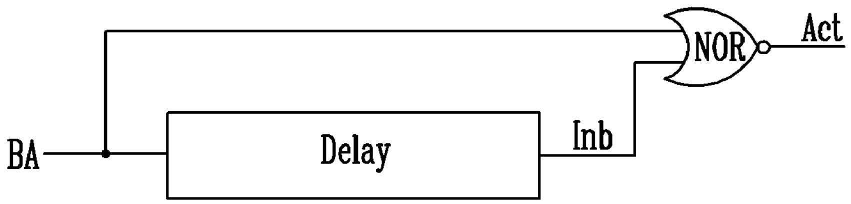
FIG. 3B is a view illustrating the circuit for changing the dead zone window coupled to a dead zone gate, according to the circuit in FIG. 3A.

FIG. 3B is a schematic for changing the dead zone window coupled to a dead zone gate in FIG. 3A.

Referring to FIG. 3B, the circuit for changing the dead zone window includes a delay for delaying an input time during a predetermined time and a NOR gate.

In an operation mode of the DRAM, the Delay receives a bank active signal BA for commanding operation of a memory cell bank, delays the bank active signal BA during the predetermined delay time, and then outputs the delayed signal Inb. Here, the delay time is optionally adjusted by a user so that the dead zone window is controlled.

The NOR gate receives the bank active signal BA and the delayed signal Inb, and outputs an act signal Act that is the output of the NOR gate in accordance with the signals BA and Inb.

The active signal Act in FIG. 3B is inputted to the nodes nodeb and nodec as shown in FIG. 3A.

Hereinafter, the operation of the circuit for changing the dead zone window will be described in detail.

In case that the bank active signal BA is changed from low level to high level by the operation mode, the "Delay" delays a time corresponding to a certain delay time, and then outputs the signal Inb, which is changed from low level to high level. Accordingly, in case that the bank active signal BA has high level, output Act of the NOR gate has a low level. In addition, in case that the bank active signal BA is changed to low level, the NOR gate outputs the signal Act, which has a high level after the delay time.

Hereinafter, the operation of the circuit in FIG. 3A in accordance with the circuit for changing the dead zone window will be described in detail.

In case of operating the operation mode, the bank active signal BA has high level. Accordingly, the output Act of the NOR gate has low level.

The output Act is inputted to the tenth P-MOS transistor MP10 and the fifth N-MOS transistor MN5 in FIG. 3A. Here, since the output Act has a low level, the tenth P-MOS transistor MP10 is turned on, and the fifth N-MOS transistor MN5 is turned off. Accordingly, the third path PA3 is enabled, and the fourth path PA4 is disabled. In other words, the core voltage $V_{CORE}$, i.e., the supply voltage, is rapidly supplied through the paths PA1 and PA3, and is discharged slowly through the second path PA2. Accordingly, the bit line precharge voltage $V_{BLP}$ provided to the OUT node corresponds to high power having short dead zone.

In case that the operation mode is finished, a standby mode is active. In the standby mode, the bank active signal BA is changed to a low level. Accordingly, the output Act of the NOR gate is changed to a high level. In this case, the output Act is changed to a high level after the delay time set to the Delay.

In case that the output Act of the circuit for changing the dead zone window in FIG. 3B has a high level, the tenth P-MOS transistor MP10 is turned off, and the fifth N-MOS transistor MN5 is turned on. Accordingly, the third path PA3 is disabled, and the fourth path PA4 is enabled. The supply voltage is supplied through only the first path PA1, and is rapidly passed to the ground through the second and fourth paths PA2 and PA4. This makes the dead zone window wide, and reduces the consumption of the power.

Figure 4:
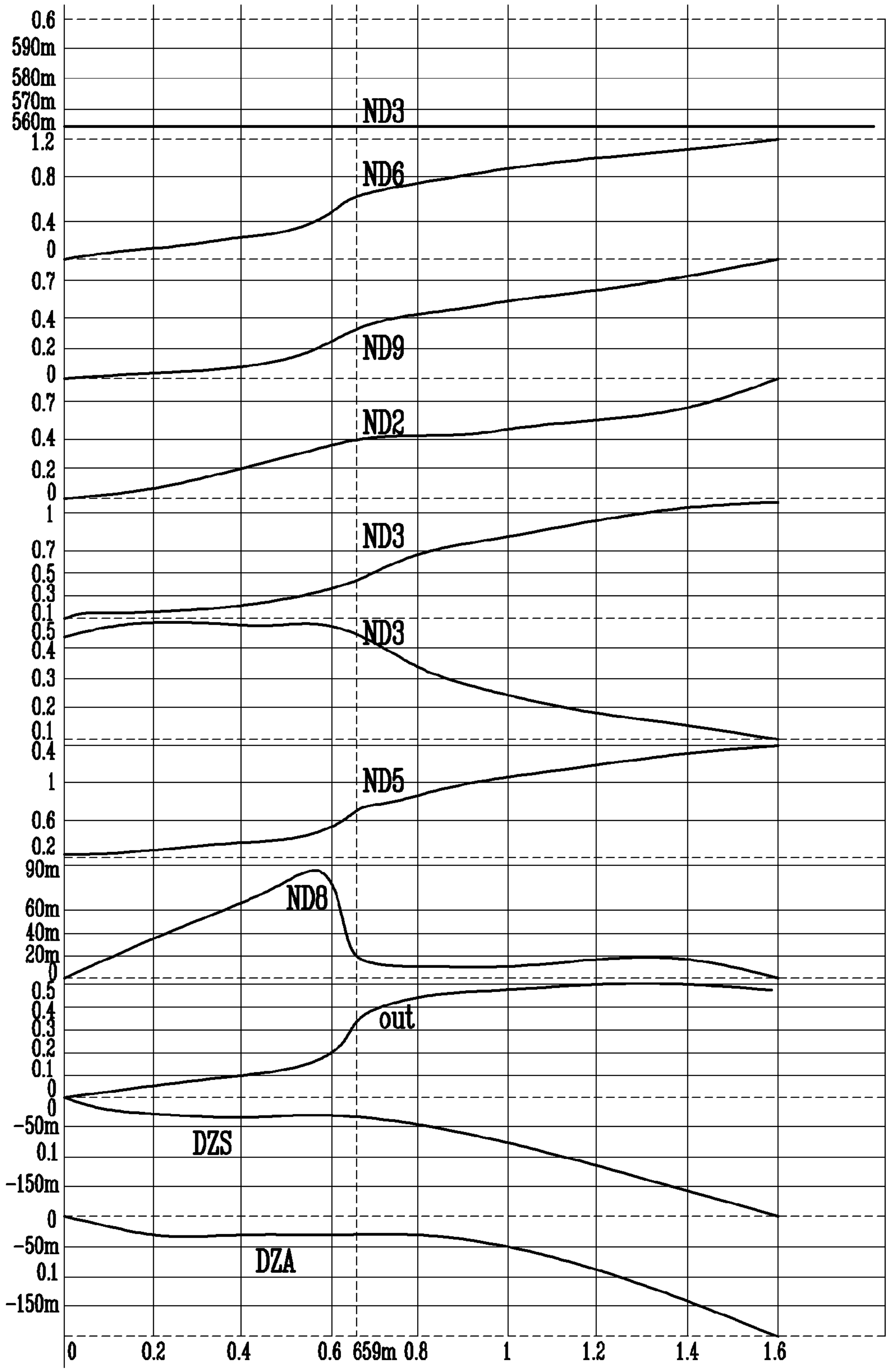
FIG. 4 is a view illustrating the level change of each of nodes in accordance with the operation of the circuit in FIG. 3A.
Figure 5:
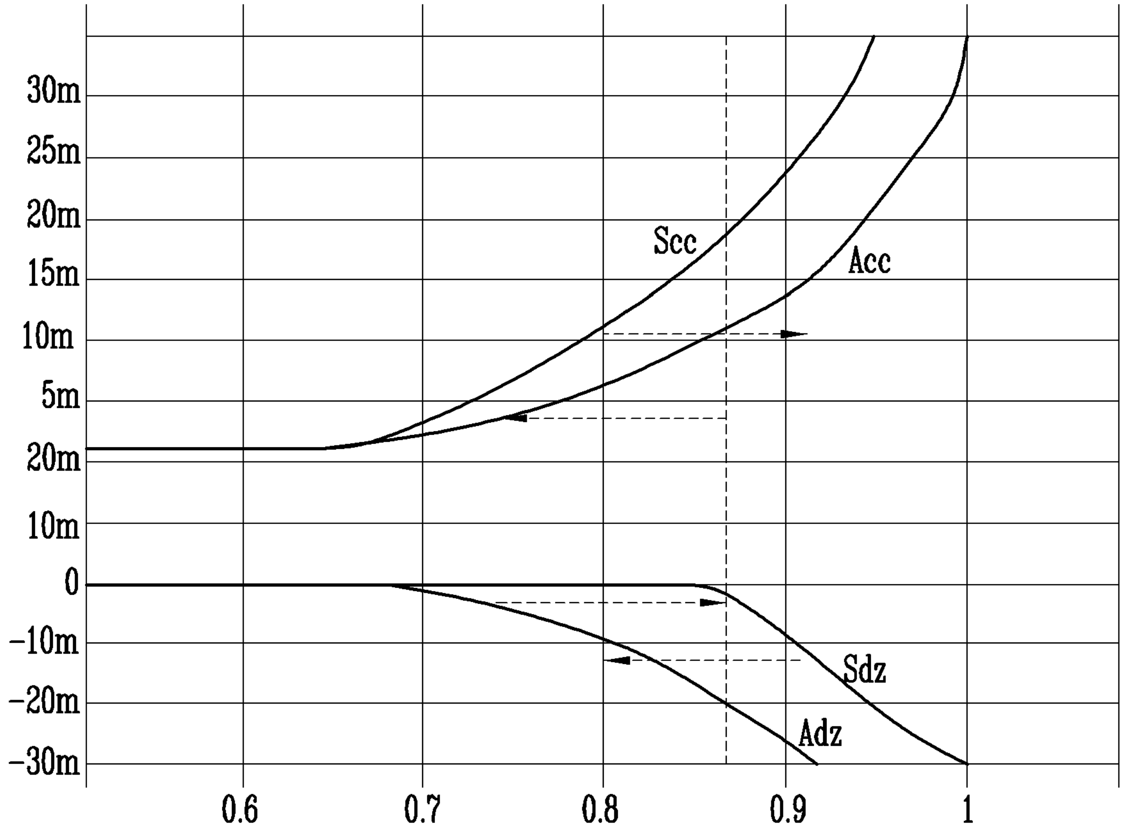
FIG. 5 is a view illustrating dead zone simulation in accordance with the operation of the circuit in FIG. 3A.

FIG. 4 is a view illustrating the level change of each of nodes in accordance with the operation in FIG. 3A. FIG. 5 is a view illustrating dead zone simulation in accordance with the operation in FIG. 3A.

Referring to FIG. 4, a signal having a constant low level is inputted to the node ND3. In addition, FIG. 4 shows the level change of each of nodes.

Referring to FIG. 5, the dead zone window is small in the operation mode, and so is changed into a dead zone active ADZ. As a result, the consumption of current in the operation mode is increased as indicated by an active current consumption ACC.

In the standby mode, the dead zone window is widened, and so is changed into a dead zone standby SDZ, as shown in FIG. 5. Accordingly the consumption of current is reduced, as shown by a standby current consumption SCC.

The consumption of power is controlled by inputting the bank active signal BA into the circuit for supplying the bit line precharge voltage $V_{BLP}$ through the circuit for changing the dead zone so that the charging velocity and the discharging velocity of the supply voltage is controlled as shown in FIG. 3A and FIG. 3B.

The above circuit for supplying the bit line precharge voltage $V_{BLP}$ is used as the circuit for supplying the cell plate voltage $V_{CP}$. In this case, the circuit may control the dead zone window and the consumption of current as described above.

In the above embodiment of the present invention, the core voltage $V_{CORE}$ is used as the supply voltage, but may be used in a circuit using another voltage.

In addition, in the above embodiment, the bank active signal BA is used as the controlling signal, but other controlling signal may be used.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A circuit for supplying a voltage in a memory device, comprising:

a voltage supplying unit having an output terminal, a first path and a second path, wherein the voltage supplying unit is coupled between a voltage source and a ground, the first path is coupled between the voltage source and the output terminal, and the second path is coupled between the output terminal and the ground;

a third path coupled between the voltage source and the output terminal for transferring a voltage of the voltage source to the output terminal in response to a control signal;

a fourth path coupled between the output terminal and the ground for discharging a voltage of the output terminal to the ground in response to the control signal; and a controller for generating the control signal by combining a bank active signal, which is enabled when the memory device is an active mode, and a delay signal, which is obtained by delaying the bank active signal for a predetermined delay time, wherein said controller is coupled to the third and fourth paths for supplying the control signal to said third and fourth paths.

2. The circuit of claim 1, wherein the controller comprises a NOR gate having an output from which the controlling signal is outputted, and inputs into which the bank active signal and the delayed bank active signal are inputted.

3. The circuit claim 1, wherein the first path and the second path are alternately enabled.

4. The circuit of claim 1, wherein the third path is enabled and the fourth path is disabled in the active mode based upon the controlling signal at a first level, and the fourth path is enabled and the third path is disabled in a standby mode based upon the controlling signal at a second level different from the first level.

5. The circuit of claim 1, wherein the third path section includes a first transistor and the fourth path section includes a second transistor, wherein one of the first and second transistors is an n type transistor and the other of the first and second transistors is a p type transistor.

6. The circuit of claim 2, wherein the third path is different from the first path and the second path is different from the fourth path.

7. The circuit of claim 6, wherein the first path and the second path are alternately enabled.

8. The circuit of claim 6, wherein the third path is enabled and the fourth path is disabled in the active mode based upon the controlling signal at a first level, and the fourth path is enabled and the third path is disabled in a standby mode based upon the controlling signal at a second level different from the first level.

9. The circuit of claim 6, wherein the third path section includes a first transistor and the fourth path section includes a second transistor, wherein one of the first and second transistors is an n type transistor and the other of the first and second transistors is a p type transistor.

* * * * *